(12) United States Patent
Lexow

(10) Patent No.: US 11,079,880 B2
(45) Date of Patent: Aug. 3, 2021

(54) METHOD FOR MEASURING A CAPACITANCE VALUE

(71) Applicant: Leopold Kostal GmbH & Co. KG, Luedenscheid (DE)

(72) Inventor: Carl Christian Lexow, Dortmund (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 543 days.

(21) Appl. No.: 15/843,624

(22) Filed: Dec. 15, 2017

(65) Prior Publication Data

US 2018/0106843 A1 Apr. 19, 2018

Related U.S. Application Data

(63) Continuation of application No. PCT/EP2016/065190, filed on Jun. 29, 2016.

(30) Foreign Application Priority Data

Jul. 1, 2015 (DE) ...................... 10 2015 008 485.2

(51) Int. Cl.
*G06F 3/044* (2006.01)
*G01R 27/26* (2006.01)
(Continued)

(52) U.S. Cl.
CPC .............. *G06F 3/044* (2013.01); *G01D 5/24* (2013.01); *G01R 27/2605* (2013.01);
(Continued)

(58) Field of Classification Search
None
See application file for complete search history.

(56) References Cited

U.S. PATENT DOCUMENTS 4,193,063 A * 3/1980 Hitt .................. G01L 9/0072
324/678
5,257,210 A * 10/1993 Schneider ............... G01D 3/02
702/109

(Continued)

FOREIGN PATENT DOCUMENTS

DE 29924441 U1 10/2003
DE 102010041464 A1 4/2011
(Continued)

OTHER PUBLICATIONS

English Abstract for FR2968485A1 (Year: 2012).*
(Continued)

*Primary Examiner* — Catherine T. Rastovski
*Assistant Examiner* — Leonard S Liang
(74) *Attorney, Agent, or Firm* — Brooks Kushman P.C.

(57) ABSTRACT

A method for measuring a capacitance value of a capacitive sensor uses an integration process involving charge quantities being transferred in successive integration cycles from the capacitive sensor to an integration capacitor. The method includes performing the integration process until the number of integration cycles carried out has reached a number N of integration cycles to be carried out, wherein a starting value $N_{Start}$ is set to N and an end value $N_{End}$ is determined. An A/D converter measures a voltage value $U_{CI}(N)$ at the integration capacitor and the voltage value is added to a voltage sum value $U_{Total}$. The number N is increased by a value n, where n is at least one and is less than $N_{Diff}=N_{End}-N_{Start}$. The steps are repeated until the number N exceeds the end value $N_{End}$. The ending voltage sum value is indicative of the capacitance value of the capacitive sensor.

11 Claims, 2 Drawing Sheets

(51) Int. Cl.
  *H03K 17/96* (2006.01)
  *H03K 17/955* (2006.01)
  *G01D 5/24* (2006.01)

(52) U.S. Cl.
  CPC ......... *H03K 17/955* (2013.01); *H03K 17/962* (2013.01); *G01D 5/2403* (2021.05); *G06F 3/0441* (2019.05); *G06F 3/0442* (2019.05); *G06F 3/0443* (2019.05); *G06F 3/0444* (2019.05); *G06F 3/0445* (2019.05); *G06F 3/0446* (2019.05); *G06F 3/0447* (2019.05); *G06F 3/0448* (2019.05); *H03K 2217/960725* (2013.01)

(56) References Cited

U.S. PATENT DOCUMENTS

| | | | | |
|---|---|---|---|---|
| 5,461,321 | A * | 10/1995 | Sanders | G01R 27/2605 324/678 |
| 6,466,036 | B1 | 10/2002 | Philipp | |
| 6,828,802 | B2 * | 12/2004 | Schulte | G01L 9/125 324/658 |
| 7,782,068 | B2 * | 8/2010 | Kuang | G01R 27/2605 324/658 |
| 8,169,238 | B1 * | 5/2012 | Maharyta | H03K 17/955 327/101 |
| 8,207,944 | B2 * | 6/2012 | Geaghan | G06F 3/044 178/18.06 |
| 8,384,403 | B2 * | 2/2013 | Zollner | G03G 15/5037 324/699 |
| 8,552,994 | B2 | 10/2013 | Simmons | |
| 8,564,313 | B1 * | 10/2013 | Ryshtun | G01R 27/2605 324/678 |
| 8,570,052 | B1 * | 10/2013 | Mahartya | G01R 27/2605 324/658 |
| 9,214,938 | B2 * | 12/2015 | Ballan | G06F 3/0416 |
| 9,304,156 | B2 | 4/2016 | Weingaertner et al. | |
| 9,317,164 | B2 * | 4/2016 | Suwald | G01D 5/24 |
| 9,383,395 | B1 * | 7/2016 | Ogirko | G01R 27/2605 |
| 9,383,726 | B2 * | 7/2016 | Ooshima | G01R 23/10 |
| 9,817,537 | B1 * | 11/2017 | Shakya | G06F 3/044 |
| 10,101,862 | B2 * | 10/2018 | Borgmann | G06F 3/044 |
| 2002/0135384 | A1 * | 9/2002 | Strack | G01D 5/2412 324/662 |
| 2006/0017449 | A1 * | 1/2006 | Takekawa | G01D 5/24 324/683 |
| 2008/0022762 | A1 * | 1/2008 | Skurnik | B60C 23/0408 73/146.5 |
| 2008/0061800 | A1 * | 3/2008 | Reynolds | G01R 27/2605 324/678 |
| 2008/0116904 | A1 * | 5/2008 | Reynolds | G06F 3/0416 324/678 |
| 2008/0142281 | A1 * | 6/2008 | Geaghan | G06F 3/044 178/18.06 |
| 2009/0002206 | A1 * | 1/2009 | Kremin | H03K 17/16 341/33 |
| 2009/0243631 | A1 * | 10/2009 | Kuang | G01R 27/2605 324/658 |
| 2010/0013502 | A1 * | 1/2010 | Kuang | G01R 27/2605 324/686 |
| 2010/0181180 | A1 | 7/2010 | Peter | |
| 2010/0283485 | A1 | 11/2010 | Vaelisuo et al. | |
| 2011/0073383 | A1 | 3/2011 | Simmons | |
| 2011/0261006 | A1 | 10/2011 | Joharapurkar et al. | |
| 2012/0062244 | A1 * | 3/2012 | Santana | G01D 5/24 324/658 |
| 2012/0112817 | A1 * | 5/2012 | Guedon | H03M 3/356 327/517 |
| 2012/0268142 | A1 * | 10/2012 | Kremin | G06F 3/0416 324/658 |
| 2013/0021294 | A1 * | 1/2013 | Maharyta | G06F 3/0416 345/174 |
| 2013/0187668 | A1 * | 7/2013 | Entringer | G01D 5/24 324/679 |
| 2013/0321006 | A1 | 12/2013 | Weingaertner et al. | |
| 2014/0039819 | A1 | 2/2014 | Simmons | |
| 2014/0091815 | A1 * | 4/2014 | Suwald | G01R 27/2605 324/658 |
| 2014/0152610 | A1 * | 6/2014 | Suwald | G01D 5/24 345/174 |
| 2014/0197851 | A1 * | 7/2014 | Astley | G01R 27/02 324/660 |
| 2015/0035794 | A1 * | 2/2015 | Zhitomirskiy | G06F 3/0416 345/174 |
| 2015/0091859 | A1 * | 4/2015 | Rosenberg | G06F 3/044 345/174 |
| 2015/0302289 | A1 * | 10/2015 | Suwald | G07F 7/0873 235/492 |
| 2016/0092026 | A1 * | 3/2016 | Stevenson | G06F 3/044 345/174 |
| 2016/0170532 | A1 * | 6/2016 | Suwald | G06F 3/044 345/174 |
| 2016/0245672 | A1 * | 8/2016 | Entringer | G01D 5/24 |
| 2016/0349872 | A1 * | 12/2016 | Hargreaves | G06F 3/044 |
| 2017/0010721 | A1 * | 1/2017 | Borgmann | G06F 3/0416 |
| 2017/0090609 | A1 * | 3/2017 | Petrovic | G06F 3/04182 |
| 2018/0337684 | A1 * | 11/2018 | Rogi | H03M 1/56 |

FOREIGN PATENT DOCUMENTS

| | | | |
|---|---|---|---|
| DE | 102011010620 A1 | 8/2012 | |
| DE | 102014007236 A1 | 11/2015 | |
| FR | 2968485 A1 * | 6/2012 | .......... H03K 17/955 |
| FR | 2968486 A1 * | 6/2012 | ............. G06F 3/044 |
| WO | 2015173241 A1 | 11/2015 | |

OTHER PUBLICATIONS

English Abstract for FR2968486A1 (Year: 2012).*
The International Bureau of WIPO, International Preliminary Report on Patentability for International Application No. PCT/EP2016/065190, dated Jan. 2, 2018.
European Patent Office, International Search Report for the corresponding International Application No. PCT/EP2016/065190, dated Sep. 30, 2016.
German Patent and Trademark Office, German Search Report for the corresponding German Patent Application No. 10 2015 008 485.2 dated Apr. 11, 2016.

* cited by examiner $$U_{C_i}(N) = \sum_{k=1}^{N} \frac{C_M}{C_M + C_i} \cdot (U_v - U_{C_i}(k-1)) \qquad U_{C_i}(0) = 0$$

METHOD FOR MEASURING A CAPACITANCE VALUE

CROSS-REFERENCE TO RELATED APPLICATIONS

This application is a continuation of International Application No. PCT/EP2016/065190, published in German, with an International filing date of Jun. 29, 2016, which claims priority to DE 10 2015 008 485.2, filed Jul. 1, 2015; the disclosures of which are hereby incorporated in their entirety by reference herein.

TECHNICAL FIELD

The present invention relates to a method for measuring a capacitance value $C_M$ of a capacitive sensor using an integration process, wherein a terminal of the capacitive sensor is electrically connected to a terminal of an integration capacitor at a shared circuit node, the integration capacitor has a known capacitance value $C_I$ that is large compared to the capacitance value $C_M$ of the capacitive sensor, and after a number IZ of integration cycles have been carried out, an A/D converter measures a voltage $U_{CI}$ of the integration capacitor.

BACKGROUND

Methods of this type are used to evaluate capacitive sensors. Capacitive sensors include capacitive contact sensors and proximity sensors. A capacitive sensor can detect the presence of a contact or approach by an object within a sensitive area. For instance, the object may be a finger or a pen of a user. A capacitive sensor, with an appropriate design, can also detect the location of the contact or approach by the object. The contact-sensitive area may overlap a display screen, for example. In a display application, a capacitive sensor allows a user to directly interact with what is displayed on the screen and not just interact indirectly via a mouse or similar input device.

There are a number of different types of contact sensors. For example, the types of contact sensors include resistive contact sensors, contact sensors with acoustic surface waves, and capacitive contact sensors. Capacitive contact sensors, with which in particular even a mere approach may be detected, have become most widely used.

When an object touches the surface of a capacitive sensor or comes close to the capacitive sensor, a change in the capacitance value of the capacitive sensor occurs. The task of an associated controller or a measuring method used by the controller is to process the change in capacitance of the capacitive sensor to detect the triggering contact or approach.

A difficulty is that capacitance values of capacitive sensors, and particularly capacitive value changes to be detected, are very small. For this reason, the capacitive values are preferably measured using so-called integration processes. An integration process involves small charge quantities being transmitted in multiple successive cycles from the capacitive sensor to an integration capacitor. The capacitance value of the capacitive sensor, which is to be measured, is variable and relatively small. The integration capacitor has a known capacitance value that is fixed and is much larger than the capacitance value of the capacitive sensor.

DE 10 2010 041 464 A1 (corresponds to U.S. Publication No. 2011/0073383) describes a method for measuring a capacitance value of a capacitive sensor. The described method for measuring the capacitance value of the capacitive sensor uses an integration process of the type described above. As part of the implementation of the integration process, a terminal of the capacitive sensor is electrically connected to a terminal of the integration capacitor at a shared circuit node.

Various steps are used for carrying out the measurement of the capacitance value of the capacitive sensor. Thus, for example, after carrying out a preset number of so-called integration cycles, the voltage at the integration capacitor, resulting from the sum of the charge transfers that have taken place, is measured by an A/D converter and digitized. The measured voltage itself or the digitized value thereof, or the value of the measured capacitance, which is computed from this value and the known constant variables capacitance of the integration capacitor, supply voltage, and number of integration cycles, is used as the result of the measurement. Alternatively, however, in each individual integration cycle the voltage at the integration capacitor may be measured and the measurement is terminated when a predefined threshold value is reached. In this case, the measured variable, which is indicative of the capacitance value of the capacitive sensor, is then the number of integration cycles carried out until reaching the threshold value voltage.

The resolution of these measuring steps, and thus the limit for distinguishability between two states, i.e., capacitance values, is determined primarily by the resolution of the A/D converter. The A/C converter can only detect voltages in certain discrete gradations. These gradations are also referred to as quantization intervals. The region to be measured is thus quantized, i.e., divided into discrete areas, in the present case, voltage levels. During a measurement, the actual voltage, i.e., measured by analog measurement, is then associated with the value of the next higher or lower level as the digital measured value, depending on which of these levels the actual voltage is closest. The deviation of the actual voltage from the voltage level that is output by the A/D converter is the quantization error. Thus, references herein to the voltage value that is measured by the A/D converter are in each case intended to mean the digital value of the voltage level that is output by the A/D converter.

SUMMARY

An object is a method for measuring the capacitance value of a capacitive sensor using an integration process in which the method compared to the conventional method described above has an advantage of achieving a higher resolution of the measurement result with an identical resolution of the A/D converter.

A method for measuring a capacitance value $C_M$ of a capacitive sensor using an integration process involving charge quantities being transferred in multiple successive integration cycles from the capacitive sensor to an integration capacitor is provided. The method includes the following steps in succession. A step (a) of setting a number N of integration cycles to be carried out to a starting value $N_{Start}$ and determining an end value $N_{End}$ for the number N of integration cycles to be carried out. A step (b) of performing the integration process until a number IZ of integration cycles carried out has reached the number N of integration cycles to be carried out. A step (c) of measuring immediately after the step (b), by an A/D converter, a voltage value $U_{CI}(N)$ at the integration capacitor and adding the voltage value $U_{CI}(N)$ to a voltage sum value $U_{Total}$. A step (d) of increasing the number N of integration cycles to be carried out by a value n, where n is greater than or equal to one and is less than $N_{Diff} = N_{End} - N_{Start}$. A step (e) of repeating the steps, beginning with the step (b), until the number N of integration cycles to be carried out exceeds the end value $N_{End}$. A step (f) of evaluating the voltage sum value $U_{Total}$ as a measurement result, wherein the voltage sum value $U_{Total}$ is indicative of the capacitance value $C_M$ of the capacitive sensor.

A system for performing the method is also provided.

In other embodiments, a method for measuring a capacitance value of a capacitive sensor by an integration process is provided. The integration process involves: the use of an integration capacitor having a known capacitance value that is much greater than the capacitance value of the capacitive sensor; a terminal of the capacitive sensor is electrically connected to a first terminal of the integration capacitor at a shared (i.e., common) circuit node; and after a number IZ of integration cycles have been carried out, a voltage $U_{CI}$ at the integration capacitor is measured by an A/D converter.

The method includes the steps of: (a) defining a number N of integration cycles to be carried out at a start value $N_{Start}$ and determining an end value $N_{End}$ for the number N of integration cycles to be carried out; (b) initializing a voltage sum value $U_{Total}$ to the value of zero; (c) initializing a number IZ of executed integration cycles to the value of zero; (d) connecting the shared circuit node and a second terminal of the integration capacitor to a ground potential; (e) carrying out the integration process until the number IZ of executed integration cycles (i.e., the number IZ of integration cycles carried out) has reached the number N of integration cycles to be carried out; (f) adding the voltage value $U_{CI}(N)$ of the integration capacitor, determined at that moment by the A/D converter, to the voltage sum value $U_{Total}$; (g) increasing the number N by a value n, wherein n is greater than or equal to one and is less than $N_{Diff} = N_{End} - N_{Start}$; (h) repeating the steps beginning with step (e) until the number N exceeds the determined end value $N_{End}$; and (i) evaluating the voltage sum value $U_{Total}$ as a measurement result.

The method may further include the following steps: (e1) keeping the shared circuit node potential-free, while at the same time applying a known supply voltage $U_V$ to the second terminal of the integration capacitor; (e2) disconnecting the supply voltage $U_V$ from the second terminal of the integration capacitor, while at the same time connecting the shared circuit node to the ground potential; (e3) increasing the number IZ of integration cycles carried out by the value one, and repeating the steps beginning with step (e) until the number IZ of integration cycles carried out has reached the number N, predefined for that moment, of integration cycles to be carried out; and (e4) measuring the voltage $U_{CI}(N)$ at the integration capacitor by the A/D converter.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1A:
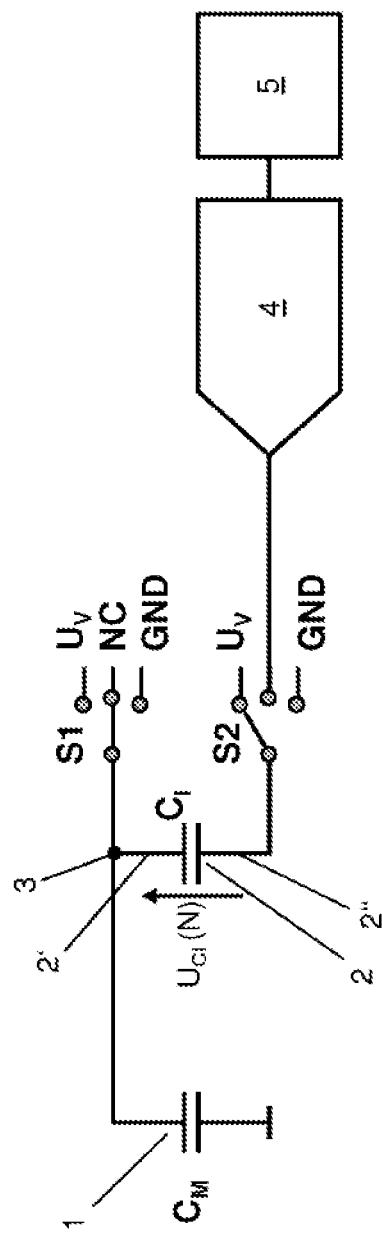
FIG. 1A illustrates a schematic illustration of a system having an integration capacitor and an arrangement of switches for carrying out an integration process to measure a capacitance value of a capacitive sensor.

Referring now to FIG. 1A, a schematic (circuit diagram) illustration of a system having an integration capacitor 2 and an arrangement of first and second switches S1 and S2 for carrying out an integration process to measure a capacitance value $C_M$ of a capacitive sensor 1 is shown. Capacitive sensor 1 forms, for example, a contact sensor having the shape of an electrode. Capacitive sensor 1 has a self-capacitance with a capacitance value $C_M$ with respect to a relative ground or earth potential. When the electrode is touched or approached, for example by a finger of a user, the capacitance value $C_M$ changes due to the contact capacitance of the capacitance value with respect to the ground or earth potential.

The system further includes an integration capacitor 2. The system uses integration capacitor 2, first switch S1, and second switch S2 to implement the integration process to measure the capacitance value $C_M$ of capacitive sensor 1. In the system, to implement the integration process, a terminal of capacitive sensor 1 is electrically connected to a first terminal 2' of integration capacitor 2 at a shared circuit node 3. Integration capacitor 2 has a known capacitance value $C_I$ that is large compared to the capacitance value $C_M$ of capacitive sensor 1 to be measured (i.e., $C_I \gg C_M$).

Shared circuit node 3 is also electrically connected to first switch S1. Shared circuit node 3, via first switch S1, is selectively (i) connectable to a fixed supply voltage $U_V$, (ii) potential-free, i.e., held open (NC), or (iii) connectable to the ground or earth potential GND, depending on the switch position of first switch S1.

A second terminal 2" of integration capacitor 2 is electrically connected to second switch S2. Second terminal 2" of integration capacitor 2, via second switch S2, is selectively connectable to (i) the fixed supply voltage $U_V$, (ii) an input of an A/D converter of the system, or (iii) the ground or earth potential GND, depending on the switch position of second switch S2.

The system uses an integration process, the basic steps of which are known, to measure the capacitance value $C_M$ of capacitive sensor 1. The integration process involves small charge quantities being transmitted from capacitive sensor 1 to integration capacitor 2 in multiple successive cycles. After a number N of these charge transfers, referred to as integration cycles, the voltage $U_{CI}(N)$ that is then present at integration capacitor 2 is measured by A/D converter 4. The voltage $U_{CI}(N)$ is directly proportional to the capacitance value $C_M$ of capacitive sensor 1. Therefore, the voltage $U_{CI}(N)$ at integration capacitor 2 is a measure of the capacitance value $C_M$ of capacitive sensor 1.

Figure 1B:
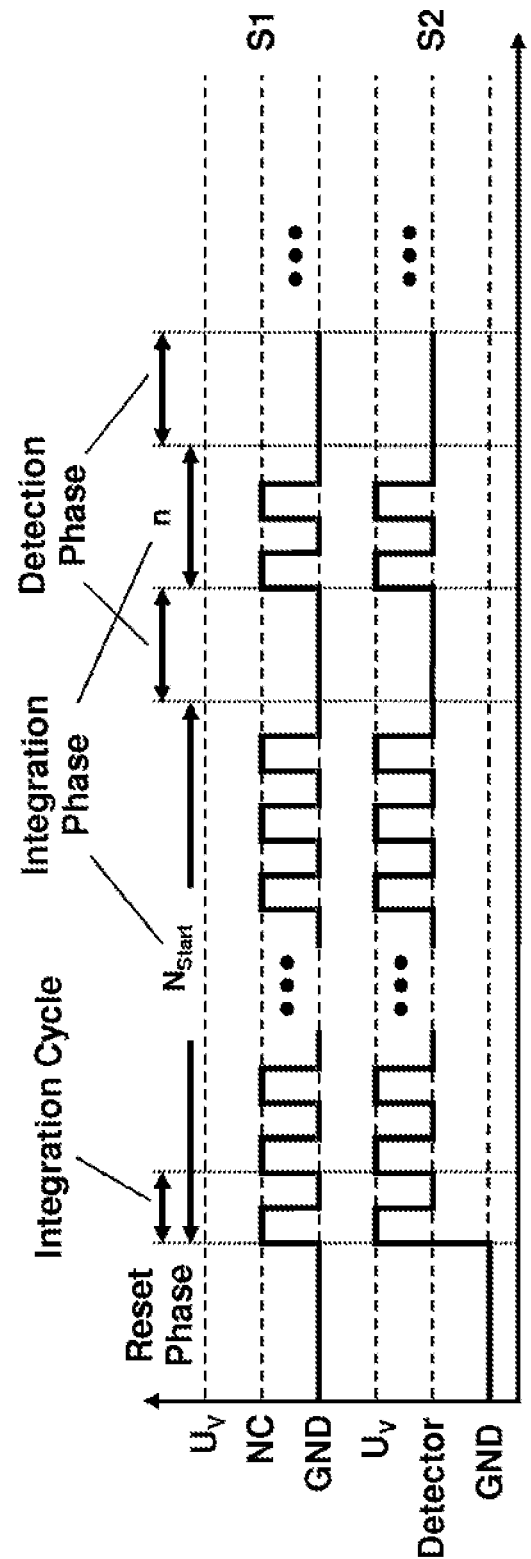
FIG. 1B illustrates a timing diagram of the switching of the switches of the system for the system to carry out the integration process including N integration cycles for measuring the capacitance value of the capacitive sensor.

Referring now to FIG. 1B, with continual reference to FIG. 1A, a timing diagram of the switching of switches S1 and S2 for the system to carry out the integration process including N integration cycles for measuring the capacitance value $C_M$ of capacitive sensor 1 is shown. An exemplary sequence for the integration process is described with reference to the timing diagram. The following steps represent the sequence of an integration cycle of the integration process.

Shared circuit node 3, connected to first terminal 2' of integration capacitor 2, is held open, and thus potential-free, by first switch S1. Concurrently, the supply voltage $U_V$ is applied to second terminal 2" of integration capacitor 2 by second switch S2. The supply voltage $U_V$ is then disconnected from second terminal 2" of integration capacitor 2 by second switch S2 and is held potential-free. Concurrently, shared circuit node 3 is connected to the ground potential GND by first switch S1.

During the course of a measurement, the steps of this integration cycle are carried out repeatedly. Particularly, the integration cycle is repeated successively until the number IZ of integration cycles carried out has reached a predefined number N ("Integration Phase" shown in FIG. 1B). The voltage $U_{CI}(N)$ at integration capacitor 2 after these N integration cycles is subsequently measured by A/D converter 4 by connecting second terminal 2" of integration capacitor 2 to the input of A/D converter 4 by second switch S2 ("Detection Phase" shown in FIG. 1B).

The measured (digital) voltage value $U_{CI}(N)$ is transmitted from A/D converter 4 to a controller 5 of the system. Controller 5 further processes and evaluates the measured (digital) voltage value $U_{CI}(N)$. Controller 5 controls the sequence of the entire described method and integration process, and for this purpose includes a microcontroller, for example, as a key element.

Figure 2:
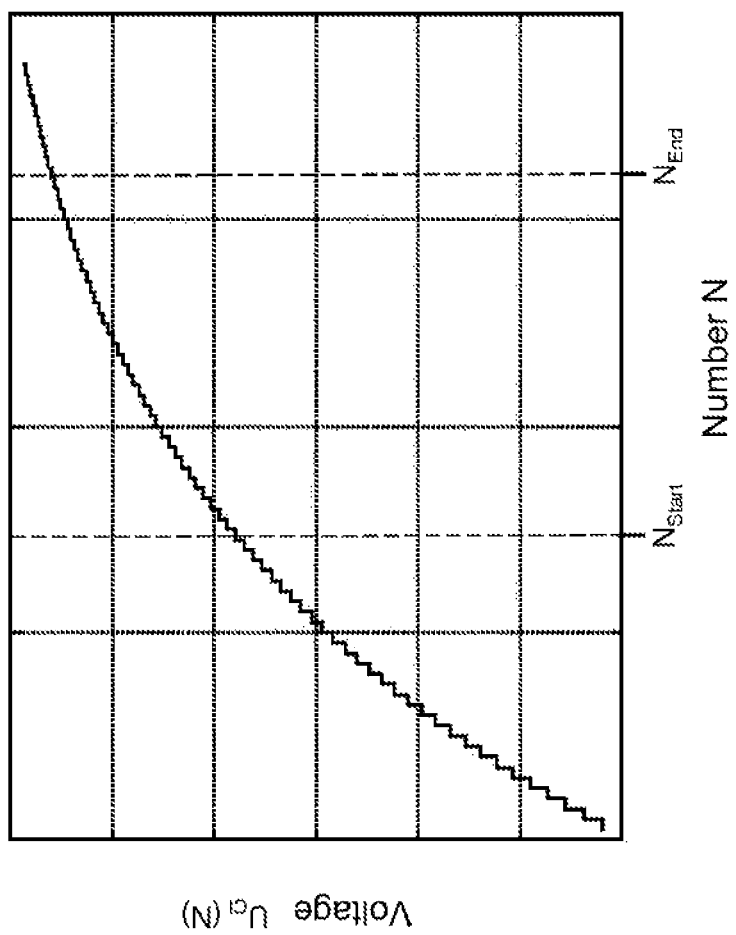
FIG. 2 illustrates a plot of the voltage ($U_{CI}(N)$) at the integration capacitor as a function of the number (N) of integration cycles.

In accordance with embodiments of the present invention, the above-described measurement with N integration cycles is an integral part of a higher-order sequence comprising multiple such measurements. The higher-order sequence follows the above-described measurement of N integration cycles. The measurements of the higher-order sequence have different values of the number N of integration cycles to be carried out. Each of these measurements of the higher-order sequence have integration cycles carried out in the following manner, which becomes clear from the plot, shown in FIG. 2, of the voltage $U_{CI}(N)$ applied to integration capacitor 2 as a function of the number N of integration cycles.

Initially, the number N of integration cycles to be carried out is set to a starting value $N_{Start}$ for the first measurement within the scope of the higher-order sequence. At the same time, a target or end value $N_{End}$ for the maximum number N of integration cycles to be carried out is set for the last measurement within the scope of the higher-order sequence. A voltage sum value $U_{Total}$ is initialized to the value zero. The number IZ of integration cycles carried out is initialized to the value zero.

In addition, to initialize the measuring operation, shared circuit node 3, connected to first terminal 2' of integration capacitor 2, and second terminal 2" of integration capacitor 2 are connected to the ground potential GND. Thus, the voltage $U_{CI}$ across integration capacitor 2 to set to zero (e.g., "Reset Phase" shown in FIG. 1B).

Subsequently, the integration process described above is carried out until the number IZ of integration cycles carried out, which upon each execution are increased by the value one, has reached the currently valid number N of integration cycles to be carried out. The voltage value $U_{CI}(N)$ at integration capacitor 2 is then measured by A/D converter 4 and is added to the currently valid voltage sum value $U_{Total}$.

The higher-order sequence then commences. The number N of integration cycles to be carried out is subsequently increased by a value n, and the steps described are repeated with the new number N. The number IZ of integration cycles carried out is not reset and the voltage at integration capacitor 2 is not cleared. As such, in effect, only n further integration cycles are carried out for the measurement step and the voltage at the integration capacitor 2 is correspondingly further increased.

The increment value n is at least equal to one and is less than the difference $N_{Diff}=N_{End}-N_{Start}$ between the starting value $N_{Start}$ and the target or end value $N_{End}$. To not obtain a quantity of measurements, with N integration cycles each, that is too small as the integral part of the higher-order sequence, the increment value n is generally selected to be much lower than $N_{Diff}$. The increment value may either vary from measurement step to measurement step, or may assume a constant value of n=1, n=2, n=3, for example, or some other value. Repetition of the measurement step with the new number N takes place until the new number N exceeds the end value $N_{End}$ determined at the start.

This is illustrated in FIG. 1B by way of example for n=2, with reference to the first two integration and detection phases. The first integration phase includes $N_{Start}$ integration cycles. The first detection phase subsequently takes place, in which the voltage $U_{CI}(N_{Start})$ at integration capacitor 2 at that moment is measured. In the second integration phase that follows, n=2 further integration cycles are executed. As such, the voltage $U_{CI}(N_{Start}+2)$ at integration capacitor 2 now results from a total of $N_{Start}+2$ integration cycles. The n=2 integration cycles that are executed are part of a measurement step and the resulting voltage $U_{CI}(N_{Start}+2)$ at integration capacitor 2 is the voltage at the integration capacitor at the end of this measurement step. The measurement steps are continued in this way until the voltage $U_{CI}(N_{End})$ is ultimately measured as the last value.

The voltage sum value $U_{Total}$ that has been summed up to this point in time from the respective measured voltages $U_{CI}(N)$, $U_{CI}(N_{Start}+2)$, $U_{CI}(N_{Start}+4)$, ... $U_{CI}(N_{End})$ is then evaluated as the measurement result.

Thus, as described, the individual measured voltage values ($U_{CI}(N)$, $U_{CI}(N_{Start}+2)$, $U_{CI}(N_{Start}+4)$, ... $U_{CI}(N_{End})$) are entered as summands in the voltage sum value $U_{Total}$. Each of these voltage values has been determined by A/D converter 4, and therefore contains a quantization error, as explained above. The quantization proceeds linearly over the measuring range; i.e., the gradation heights of the voltage levels output by A/D converter 4 are the same in each case. In contrast, since the plot of the voltage $U_{CI}(N)$, present at integration capacitor 2, as a function of the number N of integration cycles is non-linear, as is apparent in FIG. 2, a statistical distribution of the quantization errors is obtained which, as a whole, results in at least partial compensation of same.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method for measuring a capacitance value $C_M$ of a capacitive sensor, the method comprising the following steps:

(a) performing an initial integration process involving charge quantities being transferred in N successive integration cycles from the capacitive sensor to an integration capacitor, where N is an integer of at least two;
(b) measuring immediately after the step (a), by an A/D converter, an initial voltage value at the integration capacitor and adding the initial voltage value to a voltage sum value $U_{Total}$;
(c) performing a subsequent integration process involving one or more charge quantities further being transferred in n further successive integration cycle or cycles from the capacitive sensor to the integration capacitor, where n is an integer of at least one;
(d) measuring immediately after the step (c), by an A/D converter, a subsequent voltage value at the integration capacitor and adding the subsequent voltage value to the voltage sum value $U_{Total}$;
(e) repeating the steps (c) and (d) until a total number of integration cycles of all of the performed integration processes exceeds a predetermined amount; and
(f) evaluating the voltage sum value $U_{Total}$ as a measurement result, wherein the voltage sum value $U_{Total}$ is indicative of the capacitance value $C_M$ of the capacitive sensor.

2. The method of claim 1, wherein the value n is a constant value as the step (c) is repeated.

3. The method of claim 1, wherein the value n varies as the step (c) is repeated.

4. A method for measuring a capacitance value $C_M$ of a capacitive sensor using an integration capacitor with a terminal of the capacitive sensor and a first terminal of the integration capacitor being electrically connected at a shared circuit node and the integration capacitor having a known capacitance value $C_I$ that is greater than the capacitance value $C_M$ of the capacitive sensor, the method comprising the following steps:
(a) initializing a voltage sum value $U_{Total}$ to zero;
(b) connecting the shared circuit node and a second terminal of the integration capacitor to a ground potential to reset a voltage at the integration capacitor to zero;
(c) performing an initial integration process involving charge quantities being transferred in N successive integration cycles from the capacitive sensor to the integration capacitor, where N is an integer of at least two;
(d) measuring immediately after the step (c), by an A/D converter, an initial voltage value at the integration capacitor and adding the initial voltage value to the voltage sum value $U_{Total}$;
(e) performing a subsequent integration process involving one or more charge quantities further being transferred in n further successive integration cycle or cycles from the capacitive sensor to the integration capacitor, where n is an integer of at least one;
(f) measuring after performing the step (e), by an A/D converter, a subsequent voltage value at the integration capacitor and adding the subsequent voltage value to the voltage sum value $U_{Total}$;
(g) repeating the steps (e) and (f) until a total number of all of the performed integration cycles exceeds a predetermined amount; and
(h) evaluating the voltage sum value $U_{Total}$ as a measurement result, wherein the voltage sum value $U_{Total}$ is indicative of the capacitance value $C_M$ of the capacitive sensor.

5. The method of claim 4, wherein the value n is a constant value as the step (e) is repeated.

6. The method of claim 4, wherein the value n varies as the step (e) is repeated.

7. The method of claim 4 wherein:
performing each integration cycle includes keeping the shared circuit node at a potential-free voltage while applying a known supply voltage to a second terminal of the integration capacitor and then disconnecting the known supply voltage from the second terminal of the integration capacitor while connecting the shared circuit node to the ground potential.

8. A system for measuring a capacitance value $C_M$ of a capacitive sensor, the system comprising:
an integration capacitor having a known capacitance value $C_I$ that is greater than the capacitance value $C_M$ of the capacitive sensor, wherein a first terminal of the integration capacitor is electrically connected at a shared circuit node to a terminal of the capacitive sensor;
an A/D converter;
a first switch configured to selectively connect the shared circuit node to a fixed supply voltage, an open circuit, or a ground potential;
a second switch configured to selectively connect a second terminal of the integration capacitor to the fixed supply voltage, the A/D converter, or the ground potential; and
a controller configured to control the first switch, the second switch, and the A/D converter to
(a) perform an initial integration process involving charge quantities being transferred in N successive integration cycles from the capacitive sensor to an integration capacitor, where N is an integer of at least two;
(b) measure immediately after the step (a), using the A/D converter, an initial voltage value at the integration capacitor and add the initial voltage value a voltage sum value $U_{Total}$;
(c) perform a subsequent integration process involving one or more charge quantities further being transferred in n further successive integration cycle or cycles from the capacitive sensor to the integration capacitor, where n is an integer of at least one;
(d) measure immediately after the step (c), by an A/D converter, a subsequent voltage value at the integration capacitor and adding the subsequent voltage value to the voltage sum value $U_{Total}$;
(e) repeat the steps (c) and (d) until a total number of integration cycles of all of the performed integration processes exceeds a predetermined amount; and
evaluate the voltage sum value $U_{Total}$ as a measurement result, wherein the voltage sum value $U_{Total}$ is indicative of the capacitance value $C_M$ of the capacitive sensor.

9. The system of claim 8, wherein the value n is a constant value as the step (c) is repeated.

10. The system of claim 8, wherein the value n varies as the step (c) is repeated.

11. The system of claim 8 wherein:
performing each integration cycle includes the controller controlling the first switch and the second switch to
keep the shared circuit node at a potential-free voltage while the fixed supply voltage is connected to the second terminal of the integration capacitor and then disconnect the fixed supply voltage from the second terminal of the integration capacitor while the shared circuit node is connected to the ground potential.

\* \* \* \* \*